United States Patent [19]

Rohloff

[11] 4,242,437

[45] Dec. 30, 1980

[54] PHOTOSENSITIZED POLYAMIC ACIDS CURABLE BY EXPOSURE TO ACTINIC RADIATION

[75] Inventor: Robert R. Rohloff, Afton, Minn.

[73] Assignee: Minnesota Mining and Manufacturing Company, Saint Paul, Minn.

[21] Appl. No.: 38,061

[22] Filed: May 11, 1979

[51] Int. Cl.³ .............................................. G03C 1/68
[52] U.S. Cl. ............................... 430/270; 204/159.14; 430/271; 430/306; 430/322; 430/906; 528/353
[58] Field of Search ......................... 96/115 R, 115 P; 204/159.14; 528/353; 430/269, 270, 271, 306, 322, 906, 916

[56] References Cited

U.S. PATENT DOCUMENTS

| | | | |
|---|---|---|---|
| 3,242,136 | 3/1966 | Endrey | 528/353 |
| 3,316,211 | 4/1967 | Angelo | 528/353 |
| 3,542,735 | 11/1970 | Lynch | 528/353 |
| 3,573,132 | 3/1971 | Ducloux et al. | 528/353 |
| 3,595,971 | 7/1971 | Behr | 528/353 |
| 4,043,978 | 8/1977 | Schmidt et al. | 528/353 |
| 4,055,543 | 10/1977 | D'Alelio | 528/353 |
| 4,115,231 | 9/1978 | Darons et al. | 204/159.14 |

OTHER PUBLICATIONS

Flory, *Principles of Polymer Chemistry*, 1953, pp. 161–163.

*Primary Examiner*—Jack P. Brammer
*Attorney, Agent, or Firm*—Cruzan Alexander; Donald M. Sell; Gerald F. Chernivec

[57] ABSTRACT

A photosensitized polyamic acid film comprising polyamic acid and a photoinitiator, which is curable to a polyimide upon exposure to actinic radiation in the absence of externally applied heat.

2 Claims, No Drawings

PHOTOSENSITIZED POLYAMIC ACIDS CURABLE BY EXPOSURE TO ACTINIC RADIATION

BACKGROUND OF THE INVENTION

This invention relates to the curing of films of photosensitized polyamic acid to form polyimides. More specifically, the invention relates to the photosensitization of polyamic acid by inclusion of a photoinitiator therein.

Polyimides are typically prepared by a condensation polymerization reaction between organic diamines and tetracarboxylic acid dianhydrides, and demonstrate excellent high temperature and dielectric properties. Because of the properties of polyimides, they have found broad utility in many areas.

Present commercial practice is to purchase polyimide films themselves or polyamic acid, the precursor of polyimides, in a liquid, and thus castable, form. The polyamic acid, once cast and the solvent removed, can be cured or imidized at elevated temperatures to the polyimide form. This curing temperature is in the range of 650° F.

The problem with this practice is, of course, that the number of substrates available for application of a curable polyamic acid thereto becomes somewhat limited, i.e. they must be in essence temperature-resistant. Yet, in many instances, it would be desirable to use substrates in conjunction with a polyimide which would not be heat stable at the normal elevated curing temperatures for formation of the polyimide. Such applicability has not heretofore been available.

In commonly assigned and copending application Ser. No. 38,060 it is disclosed that ultraviolet radiation can contribute to the curing of films of polyamic acid to a polyimide. The condensation polymerization reaction involved in the curing process can therefore be undertaken at a much lower temperature than was normally thought necessary. This allows use of substrates, in conjunction with polyimides, which are not normally stable to excessive temperatures.

Furthermore, by use of the ultraviolet curing, polyamic acid films attain the status of being photodefinable, i.e. a mask can be selectively utilized to cure selected areas of the polyamic acid film in an imagewise fashion, thereby allowing removal of the unexposed portions, again in an imagewise fashion.

I have now discovered that by including photoinitiators in polyamic acid films, the curing reaction to polyimides becomes significantly faster under exposure to ultraviolet radiation.

SUMMARY OF THE INVENTION

In accordance with the invention there is provided a photosensitized polyamic acid film comprising polyamic acid and at least one photoinitiator.

Because high temperatures are not necessary for curing, a variety of substrates which are not heat stable can be utilized with the resultant polyimide.

Selective curing in an imagewise fashion through an appropriate original, followed by development provides a photodefined polyimide image.

DETAILED DESCRIPTION OF THE INVENTION

Polyimides are prepared by reacting at least one organic diamine having the structural formula:

$$H_2N-R_1-NH_2$$

wherein $R_1$ is a divalent radical containing at least two carbon atoms, the two amino groups being each attached to separate carbon atoms of the divalent radical, with at least one tetracarboxylic acid dianhydride having the structural formula:

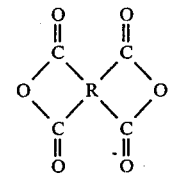

wherein R is a tetravalent radical containing at least two carbon atoms, with no more than two carbonyl groups of the dianhydride attached to any one carbon atom of the tetravalent radical. The reaction initially forms a polyamic acid, which when cured or further reacted, in the past at elevated temperatures, forms the corresponding polyimide.

The preparation of polyamic acids is disclosed in a number of United States Patents, including U.S. Pat. Nos. 3,179,614; 3,179,630; 3,179,631; and 3,073,784.

In copending and commonly assigned application Ser. No. 38060 it was disclosed that effective curing of a polyamic acid can be undertaken utilizing ultraviolet radiation. By ultraviolet radiation is meant the actinic light together with its attendant infrared energy normally connected with ultraviolet radiation. This infrared energy is not detrimental to the curing process, and in fact is an aid. However, there is no necessity for external application of heat to effectuate the curing.

The polyamic acid can be simply solvated in solvents such as N-methylpyrrolidone, dimethyl acetamide, or dimethyl formamide to provide a coating or application solution. Polyamic acid concentrations of from about 1 to about 30 percent by weight are satisfactory, increased solution viscosity and resultant application problems providing in reality the only limit as to solution concentration. From about 15 to about 20 percent by weight appears to be optimum for coating applications and is therefore preferred.

Dry film thickness of the polyamic acid is limited only by the practical considerations relative to ultraviolet exposure, with about 5 mils the maximum. Exposure to ultraviolet radiation can of course be undertaken to both sides of a polyamic acid film simultaneously, thereby maximizing ultraviolet penetration and curing of the polyamic acid to the polyimide.

Radiation intensity to effect curing can vary, with lesser intensities requiring longer exposure times. The polyamic acid should be subjected to radiation for a sufficient time, at a sufficient intensity, to cure the acid to the polyimide form.

The term "photoinitiator", as used herein corresponds to the conventional use of the term, i.e. a compound capable of undergoing photolysis upon exposure to actinic radiation, which then can initiate additional chemical reactions.

A wide variety of photoinitiators can be utilized with the polyamic acid, as is illustrated in the examples. Photoinitiator concentration is not critical, and the examples clearly illustrate that a very small initiator concentration is very effective in enhancing the curing reaction.

My invention will now be described in more detail by the use of the following non-limiting examples, wherein all parts are by weight unless otherwise specified.

EXAMPLE 1

Ten grams of RC-5085 polyamic acid solution, commercially available from DuPont, which is, as delineated by DuPont literature, a "solution of polyamic acid obtained by the reaction of aromatic diamines with aromatic dianhydrides, such as pyromellitic dianhydrided," were mixed with 0.075 gram of diethoxyacetophenone. The mixture was warmed at 60° C. for approximately ten minutes to aid solution formation.

The resultant clear solution was knife coated onto 3 mil thick polyester film, with a 7 mil wet film being applied. The coated film was then placed in a forced air oven at approximately 120° C. for a period of 15 minutes to remove solvent from the film. This resulted in a solvent-free film approximating one mil in thickness.

As soon as the sample was removed from the drying oven, the polyamic acid film was stripped from the polyester film and placed on a clean twelve inch by twelve inch rigid board for ultraviolet curing.

Curing was undertaken by passing the board and attached sample through an Ashdee ultraviolet machine, which consists of a single 200 watt per inch medium pressure mercury focused lamp. Speed through the curing unit was based on the conveyor speed of six feet per minute, which resulted in an effective dwell time of approximately 1 second under the intense area of lamp radiation. Only a single pass through the curing unit was undertaken. This resulted in a density of 0.22 watt-seconds per square centimeter, as measured using an Ashdee UV Power Density Meter measuring the 3650 angstrom wavelength.

To determine the degree of curing or crosslinking, i.e. the amount of conversion of polyamic acid to the polyimide state, a Perkin Elmer Infrared Spectrophotometer Model 727B was utilized. By comparing the samples against a fully cured and an uncured control, the degree of cure for the test sample was determined using this infrared spectrum data. Conversion was found to be 95 percent.

EXAMPLES 2-42

Example 1 was duplicated using different photoinitiators and concentration levels. The results are tabulated below.

TABLE I

| | PHOTOINITIATOR USED | WEIGHT PERCENTAGE OF PHOTOINITIATOR | PERCENTAGE OF CONVERSION TO POLYIMIDE |
|---|---|---|---|
| Example 2 | None (control) | — | 20 |
| Example 3 | Diethoxyacetophenone | 2.5 | 30 |
| Example 4 | Diethoxyacetophenone | 6.0 | 50 |
| Example 5 | Diaryl iodonium hexafluoro phosphate | .75 | 90 |
| Example 6 | Diaryl iodonium hexafluoro phosphate | 2.5 | 45 |
| Example 7 | Diaryl iodonium hexafluoro phosphate | 6.0 | 90 |
| Example 8 | Triaryl sulfonium hexafluoro antiminate | .75 | 80 |
| Example 9 | Triaryl sulfonium hexafluoro antiminate | 2.5 | 20 |
| Example 10 | Triaryl sulfonium hexafluoro antiminate | 6.0 | 90 |
| Example 11 | 2,2-dimethoxy-2-phenylacetaphenone | .75 | 70 |
| Example 12 | 2,2-dimethoxy-2-phenylacetaphenone | 2.5 | 20 |
| Example 13 | 2,2-dimethoxy-2-phenylacetaphenone | 6.0 | 30 |
| Example 14 | 2-chlorothiaxanthone | .75 | 80 |
| Example 15 | 2-chlorothiaxanthone | 2.5 | 40 |
| Example 16 | 2-chlorothiaxanthone | 6.0 | 50 |
| Example 17 | methoxystyryl bistrichloro methyl triazine | .75 | 80 |
| Example 18 | methoxystyryl bistrichloro methyl triazine | 2.5 | 50 |
| Example 19 | methoxystyryl bistrichloro methyl triazine | 6.0 | 80 |
| Example 20 | Ultra cure 100 (Sherwin Williams) | .75 | 70 |
| Example 21 | Ultra cure 100 (Sherwin Williams) | 2.5 | 60 |
| Example 22 | Ultra cure 100 (Sherwin Williams) | 6.0 | 70 |
| Example 23 | Benzoin | .75 | 40 |
| Example 24 | Benzoin | 2.5 | 20 |
| Example 25 | Benzoin | 6.0 | 20 |
| Example 26 | Benzoin ethyl ester | .75 | 50 |
| Example 27 | Benzoin ethyl ester | 2.5 | 30 |
| Example 28 | Benzoin ethyl ester | 6.0 | 50 |
| Example 29 | Michler Ketone | .75 | 20 |
| Example 30 | Michler Ketone | 2.5 | 30 |
| Example 31 | Anthracene | 1.0 | 50 |
| Example 32 | 1-chloroanthraquinone | 1.0 | 40 |
| Example 33 | Fluorescein | 1.0 | 80 |
| Example 34 | Benzoin methyl ether | 1.0 | 15 |
| Example 35 | Phenanthrenequinone | 1.0 | 70 |
| Example 36 | P-Benzoquinone | 1.0 | 70 |

TABLE I-continued

| | PHOTOINITIATOR USED | WEIGHT PERCENTAGE OF PHOTOINITIATOR | PERCENTAGE OF CONVERSION TO POLYIMIDE |
|---|---|---|---|
| Example 37 | Benzophenone and N-methyldiethanol amine (3/2) | 1.0 | 30 |
| Example 38 | 2-tert butylanthraquinone | 1.0 | 15 |
| Example 39 | Benzophenone | 1.0 | 30 |
| Example 40 | 2-naphthalene-sulfonyl chloride | 1.0 | 60 |
| Example 41 | Benzil | 1.0 | 45 |
| Example 42 | None (Control sample) | 0 | 15 |

EXAMPLES 43-58

In order to determine the relationship of the degree of conversion or curing of polyamic acid to polyimide based on the concentration of photoinitiator, Examples 43 through 58 were prepared wherein the procedure utilized was identical to that of Example 1 with the exception of the photoinitiator concentration.

TABLE II

| | PHOTOINITIATOR USED | WEIGHT PERCENTAGE OF PHOTOINITIATOR | PERCENTAGE OF CONVERSION TO POLYIMIDE |
|---|---|---|---|
| Example 43 | None (control) | 0 | 20 |
| Example 44 | Diethoxyacetophenone | .05 | 70 |
| Example 45 | Diethoxyacetophenone | .10 | 80 |
| Example 46 | Diethoxyacetophenone | .20 | 80 |
| Example 47 | Diethoxyacetophenone | .40 | 60 |
| Example 48 | Diethoxyacetophenone | .80 | 95 |
| Example 49 | Diethoxyacetophenone | 1.60 | 80 |
| Example 50 | Diethoxyacetophenone | 3.20 | 85 |
| Example 51 | Diphenyliodonium hexafluro phosphate | .05 | 95 |
| Example 52 | Diphenyliodonium hexafluro phosphate | .10 | 90 |
| Example 53 | Diphenyliodonium hexafluro phosphate | .20 | 95 |
| Example 54 | Diphenyliodonium hexafluro phosphate | .40 | 90 |
| Example 55 | Diphenyliodonium hexafluro phosphate | .80 | 85 |
| Example 56 | Diphenyliodonium hexafluro phosphate | 1.60 | 95 |
| Example 57 | Diphenyliodonium hexafluro phosphate | 3.20 | 95 |
| Example 58 | Diphenyliodonium hexafluro phosphate | 6.40 | 75 |

EXAMPLES 59-62

To compare the foregoing examples with the use of heat alone, without ultraviolet radiation, on the curing or crosslinking of polyamic acid, the procedure of Example 1 was duplicated with the exception that thermal heat was utilized at the curing medium as opposed to ultraviolet radiation. When cured at 300° F. for 15 minutes, zero percent conversion to polyimide was noted. At 400° F. for the same time span, a conversion of 80 percent was noted, at 500° F. for 15 minutes, 90 percent conversion was effected, and at 650° F. for 15 minutes, 95 percent conversion was noted.

EXAMPLES 63-68

To ascertain the effectiveness of inclusion of a photoinitiator in the polyamic acid system, non-sensitized polyamic acid films were prepared pursuant Example 1 for comparative purposes. These non-sensitized films were subjected to prolonged ultraviolet radiation as indicated in Table III below. Comparison of Table III with the data of Table I, wherein only a single pass of the ultraviolet exposure unit was utilized, clearly indicates the effectiveness of adding a photoinitiator to the polyamic acid system.

TABLE III

| | NUMBER OF PASSES (U.V.) ONE 200 W/IN. LAMP- 6'/MIN. | PERCENT CONVERSION TO POLYIMIDE |
|---|---|---|
| Example 63 | 0 | 0 |
| Example 64 | 1 | 20 |
| Example 65 | 2 | 40 |
| Example 66 | 4 | 70 |
| Example 67 | 7 | 90 |
| Example 68 | 10 | 95 |

EXAMPLES 69-78

Polyamic acids were prepared in accordance with the teachings of copending application Ser. No. 38060 utilizing benzophenone tetracarboxylic dianhydride/m-phenylene diamine (Examples 69-74) and benzophenone tetracarboxylic dianhydride/oxydianiline (Examples 75-78). Example 1 was then duplicated except that conveyor speed in the exposure unit was 10 feet per minute. The results are tabulated below.

TABLE IV

| | PHOTOSENSITIZER USED AND WEIGHT PERCENTAGE | AMOUNT OF U.V. CURE | PERCENT CONVERSION TO POLYIMIDE |
|---|---|---|---|
| Example 69 | None | No U.V. | 20 |
| Example 70 | None | 1 pass | 30 |
| Example 71 | 6 percent methoxystyryl bistrichloromethyl triazine | No U.V. | 30 |
| Example 72 | 6 percent methoxystyryl bistrichloromethyl triazine | 1 pass | 65 |
| Example 73 | 6 percent triarylsulfonium hexafluroantiminate | No U.V. | 25 |
| Example 74 | 6 percent triarylsulfonium hexafluroantiminate | 1 pass | 65 |
| Example 75 | None | No U.V. | 10 |
| Example 76 | None | 1 pass | 20 |
| Example 77 | .75 percent triarylsulfonium hexafluroantiminate | No U.V. | 15 |
| Example 78 | .75 percent triarylsulfonium hexafluroantiminate | 1 pass | 40 |

The polyamic acid can be applied to substrates unstable at elevated temperatures, e.g. paper, polyester, etc., and yet be effectively cured to the polyimide state.

What is claimed is:

1. A light sensitive article comprising a film of polyamic acid containing at least one photoinitiator therein capable of aiding in the cure of said polyamic acid upon exposure thereof to actinic radiation.

2. A light sensitive article comprising a substrate having coated on at least one surface thereof a polyamic acid containing at least one photoinitiator therein capable of aiding in the cure of said polyamic acid upon exposure thereof to actinic radiation.

* * * * *